(12) United States Patent  
Van Der Meulen

(10) Patent No.: US 6,585,470 B2
(45) Date of Patent: Jul. 1, 2003

(54) SYSTEM FOR TRANSPORTING SUBSTRATES

(75) Inventor: Peter Van Der Meulen, Newbury Port, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 18 days.

(21) Appl. No.: 09/884,824

(22) Filed: Jun. 19, 2001

(65) Prior Publication Data

US 2002/0192057 A1 Dec. 19, 2002

(51) Int. Cl.⁷ ............................................. B65G 49/07
(52) U.S. Cl. .................... 414/217; 414/939; 454/187
(58) Field of Search ................... 414/217, 935, 414/937, 217.1, 939; 454/187

(56) References Cited

U.S. PATENT DOCUMENTS

| 5,169,272 A | | 12/1992 | Bonora et al. ............. 414/217 |
| 5,370,491 A | | 12/1994 | Bonora et al. ............. 414/217 |
| 5,547,328 A | | 8/1996 | Bonora et al. ............. 414/217 |
| 5,658,123 A | | 8/1997 | Goff et al. ................. 414/786 |
| 5,772,386 A | * | 6/1998 | Mages et al. .............. 414/411 |
| 5,864,130 A | * | 1/1999 | Kahn et al. ................. 235/462 |
| 5,924,833 A | | 7/1999 | Conboy et al. ............. 414/217 |
| 6,042,623 A | | 3/2000 | Edwards .................... 29/25.01 |
| 6,050,891 A | * | 4/2000 | Nering ...................... 454/187 |
| 6,079,927 A | * | 6/2000 | Muka ........................ 414/217 |
| 6,082,951 A | | 7/2000 | Nering et al. ............ 414/217.1 |
| 6,086,676 A | * | 7/2000 | Kao et al. .................. 118/695 |
| 6,098,809 A | * | 8/2000 | Okada et al. .............. 206/711 |
| 6,157,866 A | | 12/2000 | Conboy et al. ............. 200/121 |
| 6,298,280 B1 | * | 10/2001 | Bonora et al. ............. 700/218 |
| 6,326,903 B1 | * | 12/2001 | Gross et al. ............... 700/121 |

* cited by examiner

Primary Examiner—Eileen D. Lillis
Assistant Examiner—Charles A. Fox
(74) Attorney, Agent, or Firm—Perman & Green, LLP

(57) ABSTRACT

A system for transporting substrates into a clean room is provided. The system has an isolation chamber located between the clean room and a staging area. A first movable closure is coupled to the staging area side of the isolation chamber and is adapted to open a substrate shipping container. A second movable closure is coupled to the clean room side of the isolation chamber and is adapted to open a substrate interprocess container. A substrate transfer robot is located within the isolation chamber and is adapted to transfer substrates from the substrate shipping container, opened by the first movable closure, to the substrate interprocess container opened by the second movable closure.

20 Claims, 2 Drawing Sheets

SYSTEM FOR TRANSPORTING SUBSTRATES

BACKGROUND OF THE INVENTION

1. Field of the Invention

The present invention relates to a system for transporting substrates and, more particularly, to a system for transporting substrates into a clean room.

2. Prior Art

U.S. Pat. No. 6,157,866 discloses an automated material handling system for a manufacturing facility divided into separate fabrication areas. The automated material handling system accomplishes the containerless transfer of semiconductor wafers through a wall separating first and second fabrication areas. With the event of 300 mm sized semiconductor substrates, front opening unified pods (FOUP's) have been introduced to transfer substrates between processes within a given fabrication facility. Similarly, front opening shipping boxes (FOSB's) have been introduced to ship substrates between the fabrication facilities themselves. During shipping, the interior of the FOSB remains clean in order to protect the substrates while the exterior of the FOSB is contaminated due to the shipping. Accordingly, there is a desire to provide for the containerless transfer of substrates from shipping boxes, such as FOSB's, in a contaminated staging area to interprocess carriers, such as FOUP's, within the clean fabrication facility without contamination of the clean fabrication facility.

SUMMARY OF THE INVENTION

In accordance with one embodiment of the present invention, a system for transporting substrates into a clean room is provided. The system has an isolation chamber located between the clean room and a staging area. A first movable closure is coupled to the staging area side of the isolation chamber and is adapted to open a substrate shipping container. A second movable closure is coupled to the clean room side of the isolation chamber and is adapted to open a interprocess container. A substrate transfer robot is located within the isolation chamber and is adapted to transfer substrates from the substrate shipping container, opened by the first movable closure, to the substrate processing container opened by the second movable closure.

In accordance with another embodiment of the present invention, a substrate transport system is provided. The substrate transport system has an isolation chamber. A wall is connected to the isolation chamber for separating a staging area and a clean area. A first substrate container support is coupled to the isolation chamber at a first side of the wall, and is adapted to support a substrate shipping container. A second substrate container support is coupled to the isolation chamber at a second opposite side of the wall, and is adapted to support a substrate interprocess carrier container. A substrate transfer robot is located within the isolation chamber. The substrate transfer robot is adapted to transfer substrates within the isolation chamber from the substrate shipping container to the substrate interprocess carrier container.

In accordance with one method of the present invention, a method of transferring substrates is provided. A substrate shipping container is opened at a first load port. The first load port has a first support located in a staging area. A substrate interprocess carrier container is opened at a second load port. The second load port has a second support located in a clean area. The clean area is isolated from the staging area. Substrates are transferred from the first container to the second container in an isolation chamber between the staging area and the clean area. The interior of the isolation chamber is isolated from the staging area and the clean area by the substrate shipping container at the first load port and the substrate interprocess container at the second load port at the same time.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
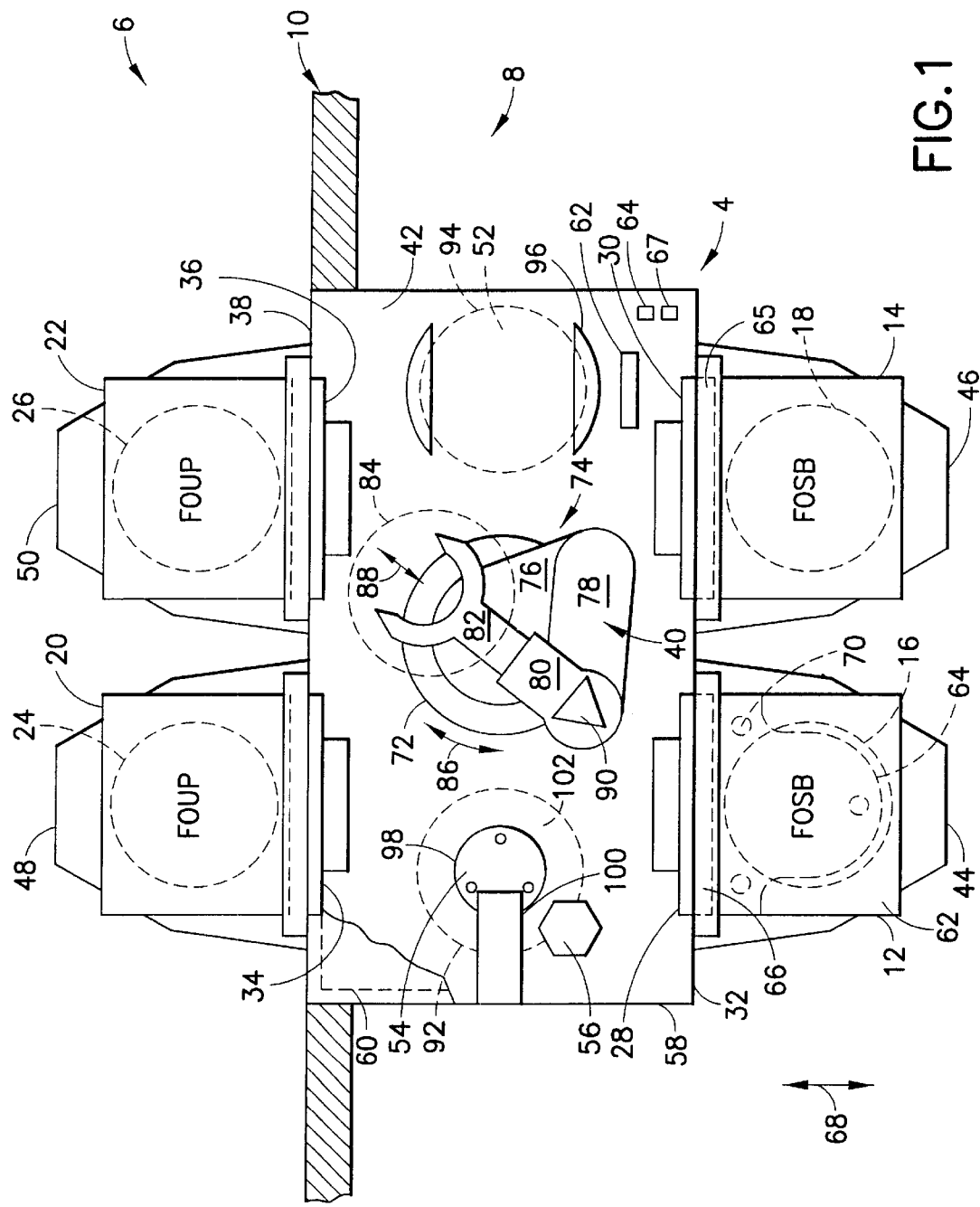
FIG. 1 is a schematic top plan view of a substrate transport system incorporating features of the present invention.

Referring to FIG. 1, there is shown, in schematic form, a top plan view of a substrate transport system 2 in accordance with teachings of the present invention. Although the present invention will be described with reference to the single embodiment shown in the drawings, it should be understood that the present invention may be embodied in many alternate forms of embodiments. In addition, any suitable size, shape or type of elements or materials could be used. The material transferred by substrate transport system 2 might include semiconductor wafers, such as Silicon, Gallium Arsenide, semi conductor packing substrates, such as high density interconnects, semiconductor manufacturing process imaging plates, such as masks or reticles, and large area display panels, such as Active Matrix LCD substrates or Field Emission Diode substrates.

Substrate transport system 2 has an isolation chamber 4 located between a clean room 6 and a staging area 8. Clean room 6 and a staging area 8 are isolated from each other by wall 10 and isolation chamber 4. Clean room 6 is maintained at a class of cleanliness cleaner than staging area 8.

Isolation chamber 4 is a mini environment enclosure. The interior 42 of isolation chamber 4 is maintained at a class of cleanliness cleaner than staging area 8 and may be maintained at a class of cleanliness cleaner that clean room 6. Movable closures 28 and 30 are coupled to the staging area side 32 of isolation chamber 4. Movable closures 34 and 36 are coupled to the clean room side 38 of the isolation chamber 4. Container supports 44 and 46 are coupled to the staging area side 32 of isolation chamber 4. Container supports 48 and 50 are coupled to the clean room side 38 of the isolation chamber 4. Mounted within interior 42 of isolation chamber 4 is a substrate transfer robot 40. Also mounted within interior 42 of isolation chamber 4 may be a substrate buffer station 52, an alignment station 54 and an optical character reader 56. The interior 42 of isolation chamber 4 is maintained at a class of cleanliness that may be cleaner than class 1 by utilizing filter and fan unit 60 to circulate and clean the air within the interior of isolation chamber 4. Isolation chamber 4 may comprise an enclosure 58 that may dissipate electrostatic charge. The filter and fan unit 60 can be mounted on the top of enclosure 58 and substantially cover the cross sectional area of enclosure 58. Filter and fan unit 60 directs air in the vertical direction from the top of enclosure 58 toward the floor. By doing so, any particles suspended within the interior 42 of isolation chamber 4 are directed toward the floor to be removed and exhausted or filtered. However, any suitable filtering and fan system or evacuation system or particle control system and configuration could be provided. To control eletrostatic discharge, one or more ionizing bars 62 may be mounted within the air flow pattern within the interior 42 of isolation chamber 4. Ionizing bar 62 ionizes the stream of clean air that flows over the substrates and equipment within the interior 42 of isolation chamber 4 allowing them to discharge any electrostatic charge that is built up. However, any suitable type of electrostatic discharge system could be provided. To control air flow and pressure within the interior 42 of isolation chamber 4, one or more airflow velocity sensors 64 and/or pressure sensors 67 may be utilized to control the flow of air from filter and fan unit 60 and the pressure difference between interior 42 of isolation chamber 4 and clean room 6 and staging area 8 with filter and fan unit 60. However, any suitable type of pressure control system or velocity control system could be provided.

The isolation chamber 4 generally comprises movable closures 28, 30, 34 and 36 and container supports 44, 46, 48 and 50. The movable closures and container supports are typically integrated units of the type disclosed in U.S. Pat. No. 5,772,386 which is hereby incorporated by reference in its entirety. However, in alternate embodiments, any suitable type of movable closures or container supports could be provided. In the embodiment shown, the isolation chamber 4 has four of the movable closures and four of the container supports. However, in alternate embodiments, more or less than four movable closures and container supports could be provided.

Container supports 44 and 46 are adapted to support substrate shipping containers such as FOSB's. Container support 44 is adapted to support substrate shipping container 12. Container support 46 is adapted to support substrate shipping container 14. Container supports 48 and 50 are adapted to support interprocess containers such as FOUP's. Container support 48 is adapted to support interprocess container 20. Container support 50 is adapted to support interprocess container 22. Although two container supports are shown to be accessible from each of clean room 6 and staging area 8, substrate transport system 2 would operate suitably with a single container support accessible from each of clean room 6 and staging area 8. Containers 12, 14 each have an enclosure 62 and supports 64 for supporting a plurality of substrates 16. Container 12 has a door 66 which, when removed, allows substrates 16 to be removed from or loaded into container 12. Similar to container 12, container 14 has a door 65 which, when removed, allows substrates 18 to be removed from or loaded into container 14.

Movable closures 28 and 30 are adapted to open substrate shipping containers such as FOSB's. Movable closure 28 is adapted to open substrate shipping container 12. Movable closure 30 is adapted to open substrate shipping container 14. Movable closures 28, 30 isolate the interior 42 from staging area 8 when containers 12, 14 are not present or not engaged with movable closures 28, 30. Movable closures 28, 30 unlatch the doors 66, 65 from containers 12, 14 and removes the doors 66, 65 from containers 12, 14 allowing substrates 16, 18 to be removed from or loaded into containers 12, 14 by robot 40. Container supports 44, 46 support the containers 12, 14 and may have kinematic pins 70 to positively locate containers 12, 14 relative to container supports 44, 46. Container supports 44, 46 may move containers 12, 14 in direction 68 such that doors 66 engages or disengages movable closures 28, 30.

Movable closures 34 and 36 are adapted to open interprocess containers such as FOUP's. Movable closure 34 is adapted to open interprocess container 20. Movable closure 36 is adapted to open interprocess container 22. Movable closures 34 and 36 operate in a similar fashion and incorporate similar features as movable closures 28 and 30. Interprocess containers 20 and 22 each has a door which, when removed, allows substrates to be removed from or loaded into containers 20 and 22. Although two movable closures are shown to be accessible from each of clean room 6 and staging area 8, substrate transport system 2 would operate suitably with a single movable closure and/or multiple movable closures accessible from each of clean room 6 and/or staging area 8.

Substrate transfer robot 40 includes a drive housing 72 and a driven arm 74. The driven arm 74 may include a first link 76 connected to drive housing 72, a second link 78 rotatably connected to the first link 76, wrist 80 rotatably connected to second link 78 and end effector 82 that may utilize a vacuum grip when moving semiconductor substrate 84. The arm 74 may move in the vertical direction and/or in the rotary direction 86 and/or in the radial direction 88 relative to drive housing 4. End effector 82 may be fixed relative to wrist 80 or may alternately be rotatable. Mapper 90 may be mounted on wrist 80 which allows robot 40 to selectively map wafer locations within robot 40's work envelope. A controller may be incorporated in drive housing 72 or mounted otherwise and typically operates and controls drive housing 72 and arm 74 such that substrate 84 may be selectively picked or placed within the work envelope of substrate transfer apparatus 40. Robot 40 is shown as a three link robot, but may alternately be any suitable substrate transfer device.

Substrate buffer station 52 is adapted to support a plurality of substrates 94 on shelves 96. One or a plurality of substrates may be unloaded from an interprocess container or shipping container by robot 40 and placed on substrate buffer station 52 before being transferred further. Substrate buffer station 52 may be placed generally anywhere within robot 40's work envelope to be utilized. In an alternate embodiment the substrate buffer station might not be provided or, alternatively any suitable buffer system could be provided.

Alignment station 54 has a rotatable chuck 98 and a scanner 100. Substrate 102 is placed on rotatable chuck 98 by robot 40. Rotatable chuck 98 rotates substrate 102 while scanner 100 samples the edge location of substrate 102. A controller determines the eccentricity of substrate 102 and communicates a correction to robot 40 such that robot 40 may pick substrate 102 on center. Alignment station 54 may alternately be integrated into robot 40 or the alignment function otherwise integrated into substrate transport system 2. In an alternate embodiment the alignment station might not be provided or, alternatively any suitable alignment system could be provided.

Optical character reader 56 may read identification characters or optical patterns on either side of a substrate. Optical character reader 56 is typically a camera with a controller that incorporates optical character recognition software. Optical character reader 56 is shown mounted at alignment station 54, but may alternately be located generally anywhere within robot 40's work envelope to be utilized. In an alternate embodiment the optical character reader might not be provided or, alternatively, any suitable type of substrate identification system could be provided.

Shipping containers, such as front opening shipping boxes (FOSB's) are used to ship substrates from one fabrication facility to another. During shipping, the interior of the FOSB remains clean in order to protect the substrates from contamination while the exterior of the FOSB is contaminated due to the shipping. Shipping boxes, such as FOSB 12 or FOSB 14, carry substrates, such as substrates 16 or 18. Interprocess substrate carriers, such as front opening unified pods (FOUP's) are used to transfer substrates between processes within a given fabrication facility. Interprocess substrate carriers, such as FOUP 20 or FOUP 22, carry substrates, such as substrates 24 or 26. Shipping containers physically differ from interprocess substrate carriers because their use is substantially different. A shipping container may be adapted to be stored in a conforming shipping box whereas the interprocess substrate carriers need not be so adapted as they remain in a clean environment. Shipping containers are not opened and closed as often as interprocess substrate carriers and therefore may have a lower cost door and door latch mechanism. The substrates in shipping carriers are not accessed as often as interprocess substrate carriers and may therefore have lower toleranced parts resulting in lower cost or reduced pitch. Shipping carriers may be smaller in size than interprocess substrate carriers to minimize shipping size and therefore may have reduced pitch between substrates to minimize container height. Shipping containers may not have automation features such as robotic gripping plates or robotic fork lifting features found in interprocess substrate carriers. This is because shipping containers may not be handled in an automated fashion as the interprocess substrate carriers are.

Substrate transfer robot 40 is located within isolation chamber 4 and transfers substrates from the substrate shipping containers 12, 14 to the substrate processing containers 20, 22. In this manner, containerless transfer of substrates from shipping boxes in a contaminated staging area to interprocess carriers within a clean fabrication facility without contamination of the clean fabrication facility is accomplished.

Figure 2:
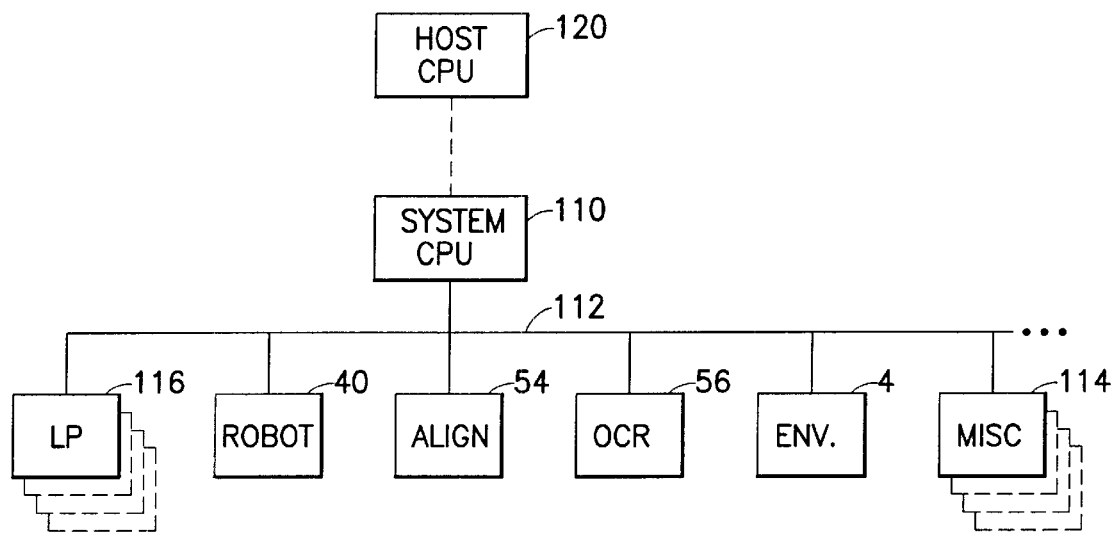
FIG. 2 is a schematic block diagram of a control system of the substrate transport system of FIG. 1.

Referring also to FIG. 2 there is shown a schematic block diagram of a control system of the substrate transport system of FIG. 1. System control 110, such as a central processor unit CPU, is a controller that communicates with sub-components over communication lines 112. Communication lines 112 may be serial communication, networked communication, wireless communication lines such as optical or radio frequency based, or otherwise. System control 110 receives instructions, responses and data from and sends instructions, responses and data to host control 120, such as another CPU. Host controller 120 typically communicates with a number of tools and may have manufacturing execution system software. System CPU 110 can communicate with sub-components such as robot 40, align station 54, optical character reader 56, environmental control system of isolation chamber, load ports 116 and miscellaneous input output I/O devices 114. Load ports 116 are typically the control means used to control the closures 28, 30, 34 and 36 and container supports 44, 46, 48 and 50. Miscellaneous I/O 114 may include a touch screen, light towers, safety switches or other miscellaneous items controlled or sensed by controller 110. Although controller 110 is shown as a single controller, it may alternately be embedded software in an already existing controller, such as the controller utilized by the robot 40.

Figure 3:
FIG. 3 is a flow chart of a method incorporating features of the present invention.

Referring also to FIG. 3 there is shown a flow chart of a method incorporating features of the present invention. The method of transferring substrates comprises a first step 130 of opening a substrate shipping container at a first load port where the first load port has a first support located in the staging area. A second step 132 is then executed of opening a substrate interprocess carrier container at the second load port where the second load port has a second support located in the clean area and the clean area being isolated from the staging area. A third step 134 is then executed of transferring substrates from the first container to the second container in an isolation chamber between the staging area and the clean area where the interior of the isolation chamber is isolated from the staging area and the clean area by the substrate shipping container at the first load port and the substrate interprocess container at the second load port at a same time. The first step of opening a substrate shipping container and the second step of opening a substrate interprocess carrier may alternately be executed simultaneously or in opposite order. In an alternate embodiment of the method all of the substrates may be transferred from the substrate shipping container to a buffer station and the substrate shipping container closed before opening the substrate interprocess carrier and transferring the substrates into the substrate interprocess carrier. In a further alternate embodiment of the method, the substrates may be aligned and/or placed in a buffer station, and/or placed in a wafer identification station, such as an OCR station or otherwise during the substrate transfer from the substrate shipping container to the substrate interprocess carrier. In a further alternate embodiment of the method, substrates may similarly be transferred from the substrate interprocess carrier to the substrate shipping container by reversing the steps or their alternates herein described.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A system for transporting substrates into a clean room, the system comprising:
   an isolation chamber adapted to be located between the clean room and a staging area;
   a first movable closure coupled to a staging area side of the isolation chamber, the first movable closure being adapted to open a substrate shipping container in the staging area;
   a second movable closure coupled to a clean room side of the isolation chamber, the second movable closure being adapted to open a substrate interprocess container in the clean room; and
   a substrate transfer robot located within the isolation chamber;
   wherein the substrate transfer robot is adapted to transfer substrates from the substrate shipping container, opened by the first movable closure, to the substrate interprocess container opened by the second movable closure.

2. The system for transporting substrates into a clean room of claim 1, wherein the substrate interprocess container is a front opening unified pod.

3. The system for transporting substrates into a clean room of claim 1, wherein the substrate shipping container is a front opening shipping box.

4. The system for transporting substrates into a clean room of claim 1 further comprising a substrate alignment module located within the isolation chamber.

5. The system for transporting substrates into a clean room of claim 1 further comprising a optical character recognition module located within the isolation chamber.

6. The system for transporting substrates into a clean room of claim 1 further comprising a substrate buffering module located within the isolation chamber.

7. The system for transporting substrates into a clean room of claim 1, wherein the staging area has a staging area cleanliness class greater than 10 and, wherein the clean room has a clean room has a cleanliness class less than 10.

8. The system for transporting substrates into a clean room of claim 1 further comprising a system controller connected to the substrate transfer robot and further connected to the first and second movable closures.

9. A substrate transport system comprising:

an isolation chamber;

a wall connected to the isolation chamber for separating a staging area and a clean area;

a first substrate container support coupled to the isolation chamber at a first side of the wall, the first substrate container support being adapted to support a substrate shipping container in the staging area;

a second substrate container support coupled to the isolation chamber at a second opposite side of the wall, the second substrate container support being adapted to support a substrate interprocess carrier container in the clean area; and a substrate transfer robot located within the isolation chamber;

wherein, the substrate transfer robot is adapted to transfer substrates within the isolation chamber from the substrate shipping container to the substrate interprocess carrier container.

10. The substrate transport system of claim 9 further comprising:

a first movable closure coupled to the isolation chamber, the first movable closure being adapted to open the substrate shipping container; and a second movable closure coupled to the isolation chamber, the second movable closure being adapted to open the substrate interprocess container.

11. The substrate transport system of claim 9, wherein the substrate shipping container is a front opening shipping box.

12. The substrate transport system of claim 9, wherein the substrate interprocess container is a front opening unified pod.

13. The substrate transport system of claim 9 further comprising a substrate alignment module located within the isolation chamber.

14. The substrate transport system of claim 9 further comprising a optical character recognition module located within the isolation chamber.

15. The substrate transport system of claim 9 further comprising a substrate buffering module located within the isolation chamber.

16. The substrate transport system of claim 9, wherein the staging area has a staging area cleanliness class greater than 10 and, wherein the clean room has a clean room cleanliness class less than 10.

17. The substrate transport system of claim 10 further comprising a system controller connected to the substrate transfer robot and further connected to the first and second movable closures.

18. A method of transferring substrates comprising:

opening a substrate shipping container at a first load port, the first load port supporting the substrate shipping container in a staging area;

opening a substrate interprocess carrier container at a second load port, the second load port supporting the interprocess carrier container in a clean area, the clean area being isolated from the staging area; and transferring substrates from the first container to the second container in an isolation chamber between the staging area and the clean area, wherein an interior of the isolation chamber is isolated from the staging area and the clean area by the substrate shipping container at the first load port and the substrate interprocess container at the second load port at a same time.

19. The method of transferring substrates of claim 18, wherein the step of opening a substrate shipping container comprises opening a front opening shipping box.

20. The method of transferring substrates of claim 18, wherein the step of opening a substrate interprocess carrier comprises opening a front opening unified pod.

* * * * *